United States Patent
Stevens et al.

(10) Patent No.: US 7,095,479 B2
(45) Date of Patent: Aug. 22, 2006

(54) LITHOGRAPHIC APPARATUS, DEVICE MANUFACTURING METHOD AND DEVICE MANUFACTURED THEREBY

(75) Inventors: Lucas Henricus Johannes Stevens, Eindhoven (NL); Martinus Hendrikus Antonius Leenders, Rotterdam (NL); Hans Meiling, Bilthoven (NL); Johannes Hubertus Josephina Moors, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 31 days.

(21) Appl. No.: 10/738,981

(22) Filed: Dec. 19, 2003

(65) Prior Publication Data

US 2005/0057734 A1    Mar. 17, 2005

(30) Foreign Application Priority Data

Dec. 20, 2002  (EP) .................................. 02258914

(51) Int. Cl.
*G03B 27/52*   (2006.01)
*G03B 27/42*   (2006.01)

(52) U.S. Cl. .......................................... 355/30; 355/53
(58) Field of Classification Search ................ 355/30, 355/53, 67–71; 250/492.2, 492.22; 356/237; 134/1.1–1.3
See application file for complete search history.

(56) References Cited

U.S. PATENT DOCUMENTS 4,665,315 A * 5/1987 Bacchetti et al. ......... 250/492.1
5,401,974 A * 3/1995 Oae et al. ................. 250/492.2
5,531,862 A * 7/1996 Otsubo et al. .............. 438/798
6,192,897 B1 * 2/2001 Klebanoff et al. ........... 134/1.1
6,411,368 B1   6/2002 Matsumoto et al.
2002/0053353 A1* 5/2002 Kawata et al. .............. 134/1.3

FOREIGN PATENT DOCUMENTS

EP       1 220 038 A1    7/2002
WO    WO02/052347 A1    7/2002

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is disclosed. The apparatus includes a radiation system that provides a beam of radiation, and a support structure that supports a patterning structure. The patterning structure is configured to pattern the beam of radiation according to a desired pattern. The apparatus also includes a substrate support that supports a substrate, a projection system that projects the patterned beam onto a target portion of the substrate, a plurality of optical elements that form part of at least one of the radiation system, the patterning structure, and the projection system; and a cleaning device. The cleaning device includes at least one cleaning beam of radiation, and a gas. The cleaning device is configured to clean an individual optical element or a subset of the plurality of optical elements.

12 Claims, 8 Drawing Sheets

LITHOGRAPHIC APPARATUS, DEVICE MANUFACTURING METHOD AND DEVICE MANUFACTURED THEREBY

CROSS-REFERENCE TO RELATED APPLICATIONS

This application is based on and claims the benefit of priority from European Patent Application No. 02258914.7 filed Dec. 20, 2002, the contents of which are incorporated herein by reference.

BACKGROUND OF THE INVENTION

1. Field of Invention

The present invention relates generally to a lithographic projection apparatus. More specifically, the present invention relates to the cleaning of optical elements of a lithographic apparatus.

2. Description of Related Art

The term "patterning device" or "patterning structure" as here employed should be broadly interpreted as referring to a device or structure that can be used to endow an incoming radiation beam with a patterned cross-section, corresponding to a pattern that is to be created in a target portion of the substrate. The term "light valve" can also be used in this context. Generally, the said pattern will correspond to a particular functional layer in a device being created in the target portion, such as an integrated circuit or other device (see below). Examples of such patterning devices include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

There is known a method of cleaning the optical elements of a lithographic apparatus using a combination of photons and gases. Several different cleaning strategies have been identified, for example, EUV radiation with oxygen, 150 nm radiation with oxygen, EUV radiation with ozone, or 150 nm radiation with ozone. The method involves supplying oxygen to the vicinity of the surface of the optical element that is required to be cleaned and thereafter supplying a cleaning beam of photons to the surface of the optical element. The cleaning beam of photons is believed to cause secondary electrons to be generated near the surface of the optical element. The secondary electrons thereafter activate the oxygen and the activated oxygen then oxidizes any carbon that may have built up on the surface of the optical element. The result is that carbon is removed from the surface of the optical element.

The above-mentioned prior art method is carried out by supplying oxygen to all of the optical elements in the lithographic apparatus and then supplying the cleaning beam of photons using the radiation system. In this way, all the optical elements in the apparatus are cleaned at the same time. Further, the whole useable surface of the optical elements is cleaned to the same degree.

SUMMARY OF THE INVENTION

Embodiments of the present invention are directed to a lithographic apparatus comprising: a radiation system for supplying a projection beam of radiation; a support structure for supporting a patterning device, the patterning device serving to pattern the projection beam according to a desired pattern; a substrate table for holding a substrate; and a projection system for projecting the patterned beam onto a target portion of the substrate.

The present invention in a first aspect stems from the realization that it is not always desirable to clean all of the optical elements at the same time or with the same cleaning rate. Embodiments of the invention therefore provide various structures for cleaning only selected ones of the optical elements in the lithographic apparatus and/or structures for causing different optical elements to undergo different cleaning rates and also to undergo spatially resolved cleaning (that is to say the cleaning rate varies across the surface of a single optical element).

It has been discovered that overcleaning of the optical element can overexpose the optical element to light which can cause irreversible reflection loss of the optical element. This problem is ameliorated in the present invention by only cleaning those optical elements that need cleaning.

It is an aspect of the present invention to overcome the problem of overexposure of the optical elements that occurs when prior cleaning methods are used.

The present invention is applicable to the cleaning of all types of optical elements including those having reflective or transmissive characteristics. Embodiments of the invention are particularly applicable to multi-layer mirrors such as disclosed in EP-A-1,065,532, EP-A-1,065,568 and European Patent Application No. 02253475.4. Furthermore, the invention is applicable to optical elements comprised of adaptive mirrors such as described in EP-A-1,174,770.

This and other aspects are addressed according to the first aspect of embodiments of the invention in a lithographic apparatus that includes a radiation system for supplying a projection beam of radiation; a support structure for supporting a patterning structure, the patterning structure serving to pattern the projection beam according to a desired pattern; a substrate table for holding a substrate; and a projection system for projecting the patterned beam onto a target portion of the substrate, characterized by a cleaning device for subjecting to cleaning individual ones of said optical elements or subsets of said optical elements using at least one cleaning beam of radiation and a gas.

In at least one embodiment, a lithographic projection apparatus is provided. The apparatus includes a radiation system that provides a beam of radiation, and a support structure that supports a patterning structure. The patterning structure is configured to pattern the beam of radiation according to a desired pattern. The apparatus also includes a substrate support that supports a substrate, a projection system that projects the patterned beam onto a target portion of the substrate, a plurality of optical elements that form part of at least one of the radiation system, the patterning structure, and the projection system; and a cleaning device. The cleaning device includes at least one cleaning beam of radiation, and a gas. The cleaning device is configured to clean an individual optical element or a subset of the plurality of optical elements.

The ability to subject only individual ones or subsets of the optical elements (i.e. not all of the optical elements) to cleaning ensures that the problem of overexposure can be reduced, because the cleanest optical elements in the system are avoided in the cleaning process. Thus, cleaning of the optical elements which require cleaning can be carried out while those optical elements that do not need cleaning are not cleaned.

An advantageous method for providing this benefit is to use one or more shutters that obstruct the path of the cleaning beam of radiation. The shutters can be positioned at various positions in the lithographic apparatus and can be selectively opened and closed so as to block the beam of radiation to one or more of the optical elements.

The use of such shutters does not on its own avoid the fact that the first optical element, (i.e. the most "upstream" optical element relative to the cleaning beam of radiation) is always subjected to cleaning when the radiation system is used to supply the cleaning beam of radiation. This is because it is necessary that the cleaning beam of radiation at least reaches the optical element to be cleaned and for this to happen it must reach all optical elements upstream of that optical element to be cleaned. This problem can be overcome by providing further radiation sources at various points along the path of the radiation. In connection with this, special cleaning masks or cleaning substrates can be inserted into the lithographic apparatus to reflect the cleaning light backwards through the system (i.e. in a direction reverse to the direction that radiation travels in normal use of the system).

According to a second aspect of embodiments of the invention, there is provided a lithographic apparatus characterized by a cleaning device or structure comprising a spatial variation device, or spatial variation means, for causing a spatially varied cleaning amount to occur across the surface of said optical element.

This aspect of the invention therefore addresses the problem that it can be possible with prior cleaning processes to clean carbon deposits from one portion of the optical element but at the same time overexpose other portions of the optical element where there are less carbon deposits present. Spatially varying the cleaning amount across the surface of the optical element allows cleaning to be concentrated on those areas where the carbon deposits are thickest, thereby avoiding overexposing areas having only low levels of carbon deposits.

The device for causing such spatially varied cleaning can be, for example, a gray filter which has varying transmissive or reflective characteristics across its extent so as to endow any cleaning beam of radiation that passes through it or is reflected from it with a spatially varying intensity.

Preferably, the gray filter has a pattern which is based on the average pattern of light received by the optical element or elements to be cleaned since the last cleaning process. This is useful because it has been found that the build-up of carbon deposits is related to the light intensity received by any particular part of the optical element in normal use. In particular, parts of the surface of the optical element receiving the most radiation tend to have the thickest carbon deposits. The pattern for the gray filter can be calculated in accordance with the known history of usage of the machine or, alternatively, detected in use. The gray filter may thus have a pattern based on the actual deposits of carbon that have been detected across the surface of the optical element. For maximum flexibility, the gray filter is capable of being dynamically adapted so that, instead of being replaced for each cleaning process, its characteristics can be changed in situ. This can be carried out by making the gray filter from a plurality of discrete elements whose transmissive or reflective characteristics can be changed selectively.

A third aspect of embodiments of the invention provides a lithographic apparatus characterized by a cleaning device for supplying a cleaning beam of radiation to the surface of said optical element, and further characterized by an electric field generator, or device for establishing an electrical field near the surface of said optical element, so that secondary electrons created by the interaction of said cleaning beam of radiation with the surface of said optical element are attracted away from the surface of said optical element; and a polarity reverser, or device for reversing the polarity of said electrical field so that said secondary electrons are then attracted toward the surface of said optical element.

The electrical field established near the surface of the optical element at first encourages electrons to move away from the surface of the optical element (and thereby pass through the oxygen in the vicinity of the surface of the optical element) and the subsequent reversal of the polarity of the electrical field causes secondary electrons to be attracted towards the surface of the optical element, such that the electrons pass through the oxygen layer twice and potentially increase the cleaning rate by a factor of two.

A fourth aspect of embodiments of the invention provides a lithographic apparatus characterized by a cleaning device for supplying a cleaning beam of radiation to the surface of said optical element, and further characterized by an electric field generator that generates an electrical field, or a device for establishing an electrical field, near the surface of said optical element; a gas supply that supplies a reactive gas, or device for supplying a reactive gas, to the vicinity of said optical element to be cleaned; and a charger that charges, or device for charging, the reactive gas molecules.

The combination of electrical field and charged reactive gas (e.g. oxygen) molecules allows a higher than average concentration of gas to be positioned near the surface of the optical element. This in turn means that a higher cleaning rate will be achieved near that optical element. It can therefore be seen that different cleaning rates for different optical elements can be achieved by varying the local gas environment using the electrical field and reactive gas ions.

Preferably, the reactive gas is oxygen that is preferably charged to be negative so that the secondary electrons do not de-charge the oxygen. In order to attract the oxygen to the surface of the optical element, the optical element can be charged positively with respect to another element located distal from the surface. Preferably, the surface of the optical element has a negative charge with respect to the oxygen particles and the element distal from the surface of the optical element has an even more negative charge so that although the surface of the optical element is negatively charged (and therefore does not de-charge the oxygen particles), it is positively charged with respect to the distal points and thus is still able to attract the oxygen particles towards its surface.

A fifth aspect of embodiments of the invention provides a lithographic apparatus characterized by a cleaning device comprising a device for subjecting the surface of said optical element to a cleaning beam of electrons in combination with a gas so as to effect cleaning of the surface of the optical element.

The cleaning beam of electrons can be magnified and/or steered so as to scan the surface of the optical element. The electrons supplied by the cleaning beam of electrons work in the same way as the secondary electrons that are created when a photon beam is used. The electrons activate the oxygen which oxides carbon on the surface of the optical element. Since the beam of electrons can be controlled, a spatially varied cleaning rate across the surface of the optical element can be achieved. A higher rate of cleaning can be achieved compared to photon cleaning since the electron density that can be provided by the electron beam is higher than that provided by the secondary electrons caused when the photons interact with the optical element surface.

A sixth aspect of embodiments of the invention provides a lithographic apparatus characterized by a generator that supplies a photon beam, or a device for supplying a photon beam to the surface of the optical element having a wavelength which will not substantially be absorbed by the optical element but which will be absorbed by any hydrocarbon or water molecules adhered to the surface of the optical element.

The absorption of the photon beam by the hydrocarbon or water molecules shortens the length of stay of these molecules on the surface of the optical element.

Preferably, the photon beam is low energy and comprises a radiation beam, for example infra-red radiation in the 1 µm to 10 µm region. Such radiation is absorbed by many contaminants (including water) and is also very well reflected by the optical element.

A variation of this aspect provides a lithographic apparatus characterized by a device for supplying microwaves to the optical element, which microwaves are absorbed by any water molecules on the surface of the optical element.

The absorption of the microwaves by the water molecules reduces the length of stay of the water molecules on the surface of the optical element.

As a variation of the sixth aspect, the photon beam (preferably infra-red radiation) or microwaves can be applied more generally into the vacuum system (rather than at specific optical elements in the vacuum system) so that any water molecules or hydrocarbons in the vacuum system will absorb the photon beam or microwaves and the length of stay of these contaminant molecules on the surfaces inside the vacuum system will be reduced. Absorption by the water molecules and/or hydrocarbon molecules of the photon beam or microwaves is believed to assist in breaking the bonds of contaminant molecules and/or heating up the contaminant molecules so as to assist in their removal from the surface of the optical element.

In accordance with the first aspect of the invention there is provided a lithographic projection apparatus cleaning method comprising the steps of: providing a cleaning beam of radiation and a gas to an optical element of a radiation system, a patterning structure or a projection system of said lithographic projection apparatus to clean said optical element, whereby another optical element of said radiation system said patterning device or said projection system is not cleaned.

In accordance with the second aspect of the invention there is provided a lithographic projection apparatus cleaning method comprising the steps of: providing a cleaning beam of radiation so as to cause a spatially varied cleaning amount to occur across the surface of an optical element forming part of a radiation system, a patterning device or a projection system of said lithographic projection apparatus.

In accordance with the third aspect of the invention there is provided a lithographic projection apparatus cleaning method comprising the steps of: establishing an electrical field near the surface of an optical element forming part of a radiation system, a patterning device or a projection system of said lithographic projection apparatus; providing a cleaning beam of radiation so that secondary electrons are created; attracting said secondary electrons away from said optical element using said electrical field; and reversing the polarity of said electrical field to thereby attract said secondary electrons toward the surface of said optical element.

In accordance with the fourth aspect of the invention there is provided a lithographic projection apparatus cleaning method comprising the steps of: establishing an electrical field near the surface of an optical element forming part of a radiation system, a patterning device or a projection system of said lithographic projection apparatus; charging oxygen gas molecules; and supplying said charged oxygen gas molecules to the vicinity of said optical element.

In accordance with the fifth aspect of the invention there is provided a lithographic projection apparatus cleaning method comprising the steps of: subjecting the surface of an optical element forming part of a radiation system, a patterning device or a projection system of said lithographic projection apparatus to a cleaning beam of electrons in combination with a gas so as to affect cleaning of the surface of the optical element.

In accordance with the sixth aspect of the invention there is provided a lithographic projection apparatus cleaning method comprising the steps of: subjecting the surface of an optical element forming part of a radiation system, a patterning device or a projection system of said lithographic projection apparatus with photons having a wavelength that is not substantially absorbed by said optical element but which breaks the bonds of hydrocarbon or water molecules adhered to the optical element.

Once the bonds of the hydrocarbon or water molecules are broken, these contaminant molecules can be pumped from the system. Thus contamination/oxidation of the optical elements inside the vessel is prevented and the pump downtime of the vacuum system is decreased.

In accordance with a variation of the sixth aspect of the invention there is provided a lithographic projection apparatus cleaning method comprising the steps of: subjecting the surface of an optical element forming part of a radiation system, a patterning device or a projection system of said lithographic projection apparatus with microwaves, which microwaves are absorbed by water molecules to reduce contamination.

There is also provided a device manufacturing method comprising the steps of: providing a substrate that is at least partially covered by a layer of radiation-sensitive material; providing a projection beam of radiation using a radiation system; using patterning device to endow the projection beam with a pattern in its cross-section; projecting the patterned beam of radiation onto a target portion of the layer of radiation-sensitive material using a projection system; said method being characterized by: cleaning the apparatus using the method of any one of the first to sixth aspects of the invention.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

Although this application focuses mainly on the removal of hydrocarbon and water molecules from the surfaces of the optical elements, other types of contaminants may also be removed. For example, oxygen deposits from oxidated ruthenium can be removed using an appropriate radiation together with carbon monoxide. It is also be possible to remove deposited silicon (e.g. from a silicon containing resist) in a similar manner. For example, gaseous hydrogen ($H_2$) can be used to remove solid Si contaminants to form gaseous $SiH_4$.

The use of infra-red radiation is preferred because it is believed that such infra-red radiation causes an energy transition in the contaminant molecules (e.g. water) that are not caused in metal. The absorption of the infra-red photons by the contaminant molecules often causes the molecules to reach an excited state and thus increases the probability of their being dislodged from the surface. Water has a very broad absorption spectrum and so it is even possible with the present invention to dislodge only water molecules, while oxygen and hydrocarbon molecules are not affected. It is preferable, however, to also dislodge hydrocarbon molecules as well as water molecules.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF EMBODIMENTS OF THE INVENTION

Figure 1:
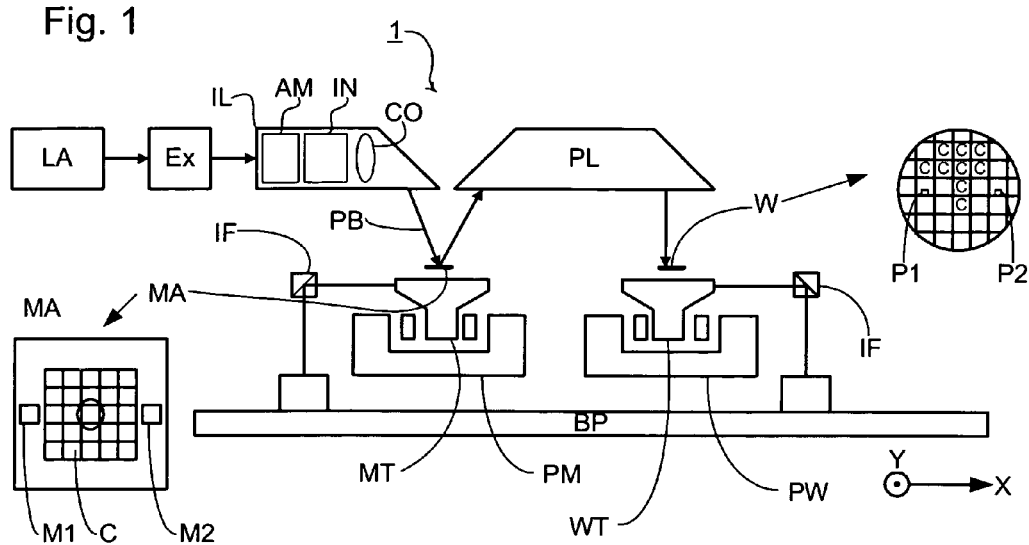
FIG. 1 depicts a lithographic projection apparatus according to an embodiment of the invention.

FIG. 1 schematically depicts a lithographic projection apparatus according to a particular embodiment of the invention. The apparatus comprises: a radiation system Ex, IL, for supplying a projection beam PB of radiation (e.g. EUV radiation), which in this particular case also comprises a radiation source LA; a first object table (mask table) MT provided with a mask holder for holding a mask MA (e.g. a reticle), and connected to a first positioning device for accurately positioning the mask with respect to item PL; a second object table (substrate table) WT provided with a substrate holder for holding a substrate W (e.g. a resist coated silicon wafer), and connected to a second positioning device for accurately positioning the substrate with respect to item PL; a projection system ("lens") PL (e.g. a mirror group) for imaging an irradiated portion of the mask MA onto a target portion C (e.g. comprising one or more dies) of the substrate W. The term "object table" as used herein can also be considered or termed as an object support. It should be understood that the term object support or object table broadly refers to a structure that supports, holds, or carries an object.

As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having a traversed conditioning device, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The embodiments of the present invention, and claims, encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning device (and an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Having now described the general operation of the lithographic apparatus, those parts of the apparatus to which embodiments of the present invention are applied will now be described.

First Aspect

This aspect of the invention is directed toward the problem that the known cleaning process supplies a cleaning beam of photons and oxygen to every optical element in the apparatus and thus does not take account of the fact that different optical elements require different amounts of cleaning. Overcleaning an optical element can lead to irreversible reflection loss.

Figure 2:
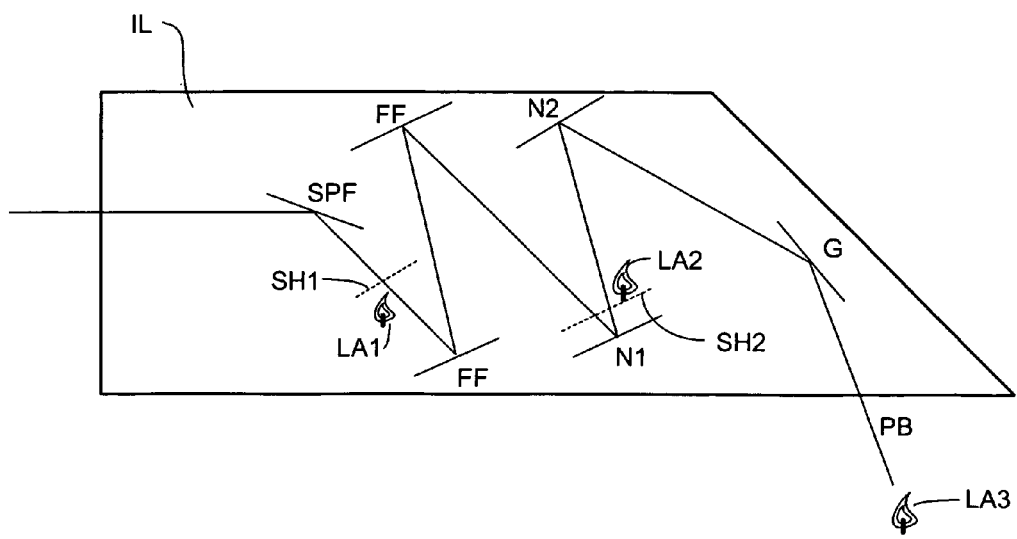
FIG. 2 depicts an illumination system according to an embodiment of the invention.

FIG. 2 shows embodiments of the invention applied to the illumination system IL. As is already known, the beam of radiation produced in the source LA enters the illumination system IL and impinges upon a first optical element, in this example, mirror SPF. The beam is then reflected by several further mirrors FF, FF, N1, N2 and G until it eventually leaves the illumination system as projection beam PB.

When it is desired to clean the optical elements, the entire illumination system is filled with oxygen and a cleaning beam of radiation is supplied. In the prior art, this cleaning beam of radiation was most readily supplied by the source LA since this required no further radiation sources to be supplied. In accordance with embodiments of the present invention, oxygen is also supplied to all internal parts of the illumination system IL but the cleaning beam of radiation is caused to interact only with individual ones of, or subsets of, the optical elements. This is achieved by using shutters SH1, SH2 which selectively obstruct the path of the cleaning beam of radiation. For example, shutter SH1 can selectively obstruct the path of radiation between mirror SPF and mirror FF. It can thus be arranged that a cleaning beam of radiation from the source LA can be caused only to clean mirror SPF and not any of the mirrors downstream of shutter SH1. As a further example, shutter SH1 could be left open (i.e. it allows radiation to pass) and shutter SH2 can be closed in which case mirrors SPF, SF and FF will be cleaned but not mirrors N1, N2 and G.

Figure 4:
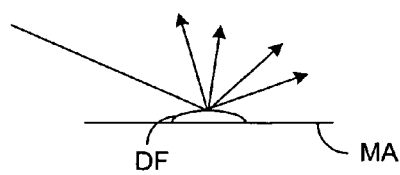
FIG. 4 depicts a modified reticle or wafer with a diffuser element, according to an embodiment of the present invention.

To add greater flexibility to the system, and to allow cleaning configurations whereby the most upstream mirrors (e.g. mirror SPF) need not be cleaned, but more downstream mirrors (e.g. mirror N2) can be cleaned, one or more additional radiation sources, LA1, LA2 and LA3 can be supplied. These are depicted as flames in FIG. 2. These radiation sources can be arranged to couple radiation into the illumination system from the side, for example, through custom made reticles with a reflecting diffuser (see FIG. 4) so that light can be reflected "the wrong way" around the illumination system. For example, radiation source LA3 depicted in FIG. 2 can be achieved by placing a special diffusive mask such as is shown in FIG. 4 onto the mask table so that a cleaning beam of radiation follows the same path as, but travels in the opposite direction to, the projection beam PB shown in FIGS. 1 and 2. This cleaning beam of radiation can then be used to clean mirrors N2 and G (with shutter SH2 closed) but none of the mirrors upstream of mirror N2.

Figure 3:
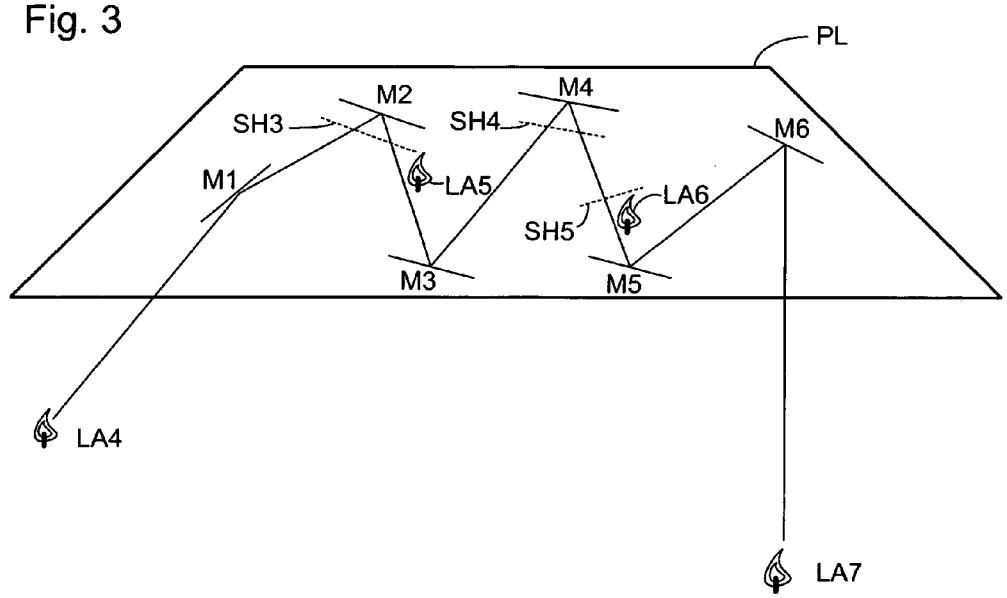
FIG. 3 depicts a projection system according to an embodiment of the present invention.

FIG. 3 shows a similar implementation of the first aspect of the invention, but this time the projection lens PL is provided with shutters SH3, SH4, SH5 and additional radiation sources LA4, LA5, LA6 and LA7. The various mirrors M1, M2, M3, M4, M5 and M6 of subsets thereof, can be isolated for cleaning in the same way as previously described.

The mask MA may have the configuration shown in FIG. 4 whereby a special diffusive element DF is provided on its surface so that a beam of light supplied to it will be reflected in numerous directions. With reference to FIG. 1, it can be seen that the diffuser can be arranged so as to project light into either the illumination system IL or the projection lens PL, or both at the same time. In this way, sources LA3 and LA4 can be provided in a simple manner.

Figure 5:
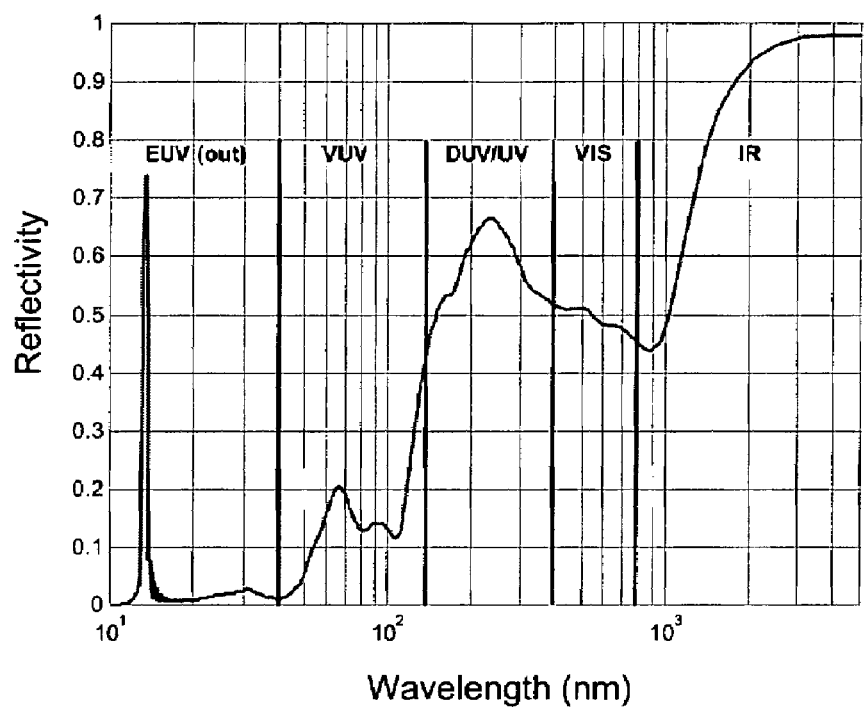
FIG. 5 is a graph showing the reflectivity of a MoSi mirror according to an embodiment of the present invention.

Any type of cleaning radiation may be used, including the EUV radiation that is used for the radiation source LA. Alternatively, DUV, IR, 173 nm, 150 nm, etc. radiation may be used. FIG. 5 shows a graph describing the spectrally resolved reflection curves of MoSi mirrors. It can be seen that such mirrors reflect both in-band EUV (around 13 nm wavelength) as well as EUV, VUV and IR radiation. Thus, cleaning of groups of mirrors with radiations other than EUV radiation can be carried out because the optical elements (the MoSi mirrors in this case) will reflect such other radiation around the relevant system. Alternatively, if it is required to clean only the first encountered mirror, and dispense with the shutters, the radiation can be selected so that it will not be substantially reflected by the first optical element it encounters. For example, out of band EUV radiation may be used (e.g. 20 nm) which will not be reflected by a MoSi mirror to a substantial extent.

The cleaning of this embodiment of the invention can be carried out in-between the exposures used to create the integrated circuits. Also, if the final resist is insensitive to the cleaning wavelength used, the cleaning method can be used in real time while exposing the resist in use.

The special cleaning reticle shown in FIG. 4 can be a simple low expansion glass without any multi-layer coating, which will work provided that the cleaning light is reflected into the optical path. Furthermore, special cleaning wafers also having a reflecting diffuser can be loaded onto the wafer stage (see FIG. 1) and the same principle can be used to clean mirrors M5 and M6 shown in FIG. 3 (i.e. this principle can be used to provide radiation source LA7).

Second Aspect

This aspect of embodiments of the invention is directed toward the problem that, if a photon beam of homogenous intensity and oxygen of unchanging spatial concentration is used, the same cleaning rate will occur across the whole surface of the optical element (e.g. multi layer mirror). However, it has been discovered that the carbon deposits on the optical elements may not be uniformly distributed across the surface of the optical element. Thus, those parts of the surface of the optical element where the carbon deposits are thinnest will be cleaned before cleaning of the thicker carbon deposits has finished. Continued cleaning will overexpose the already cleaned parts leading to irreversible reflection loss. However, if the cleaning process were to be stopped when the thinly deposited carbon is cleaned, the thick deposits will not be cleaned off.

This problem has been solved in the present case by providing a cleaning process which can cause a spatially varied cleaning amount to occur across the surface of the optical element. This means that certain parts of the optical element surface where the carbon deposits are thickest can be subjected to a higher cleaning rate than other parts of the optical element where the carbon deposits are thinner.

Figure 6:
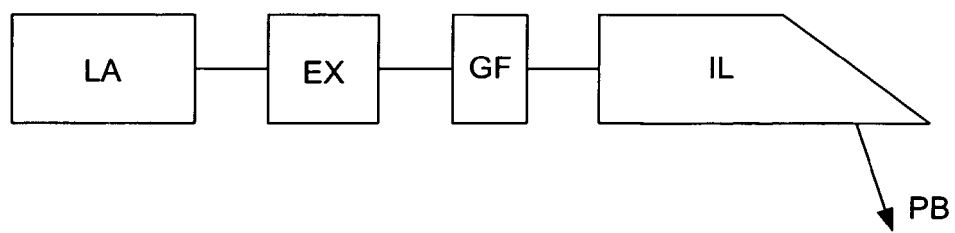
FIG. 6 depicts an illumination system with a gray filter according to an embodiment of the present invention.

It has been found that the cleaning rate depends on the intensity of radiation supplied to the surface of the optical element. Thus, a configuration such as the one that is shown in FIG. 6 can be provided. The components of FIG. 6 are similar to those shown in FIG. 1 and it will be noted that an additional gray filter GF has been included in the path of the radiation beam. The gray filter GF modifies the intensity of the beam across its width so as to be non-uniform. This means that a greater radiation intensity can be applied to those parts of the surface of the optical element to be cleaned that have the thickest carbon deposits. Thus, it can be ensured that the whole surface of the optical element is cleaned with less risk of oxidation of the surface, which leads to irreversible reflection loss. Although FIG. 6 shows this concept applied to the radiation source LA, which will, in general, be used to clean mirror SPF (see FIG. 2), it may be applied more generally so that a gray filter GF may be associated with each and every radiation source (LA1 . . . LA7) and every optical element (e.g. mirror) may have associated with it a dedicated radiation source LA and gray filter GF. The gray filter GF can be designed so that the intensity differences endowed to the cleaning beam of radiation during cleaning cause a cleaning rate process that is spatially the same as the carbon build-up process.

In part of the illumination system IL, a constant intensity profile is observed in the beam of radiation that is supplied to the optical element, in particular, the first optical element that the beam of radiation interacts with will receive a constant intensity profile since there are no NA/σ changes prior to this optical element. Thus, it may not be actually necessary to have a gray filter GF located in the position shown in FIG. 6 although it will in general be useful for cleaning other mirrors, in particular in the projection system PL which receives, in use, radiation beams having intensity profiles that depend on the feature types and sizes of the integrated circuit. Thus, the filters used for cleaning can be made to mimic the history of all of the exposures for which the optical element in question has been used.

It has been discovered that the carbon build-up on the surface of the optical element bears a close resemblance to the intensity of radiation to which the optical element is subjected in use. Thus, the gray filter GF can be constructed purely based on the known history of use of the lithographic projection apparatus.

Alternatively, the gray filter GF may be constructed based on measurements of carbon build-up and/or reflection loss of the optical element in question. The gray filters GF can be mounted internally and taken out after cleaning but this has been found to consume time. An alternative to this is to provide the gray filters GF externally and bring the cleaning photons into the optical pathway by means of fibers and feedthrough or optics and a window.

Figure 7:
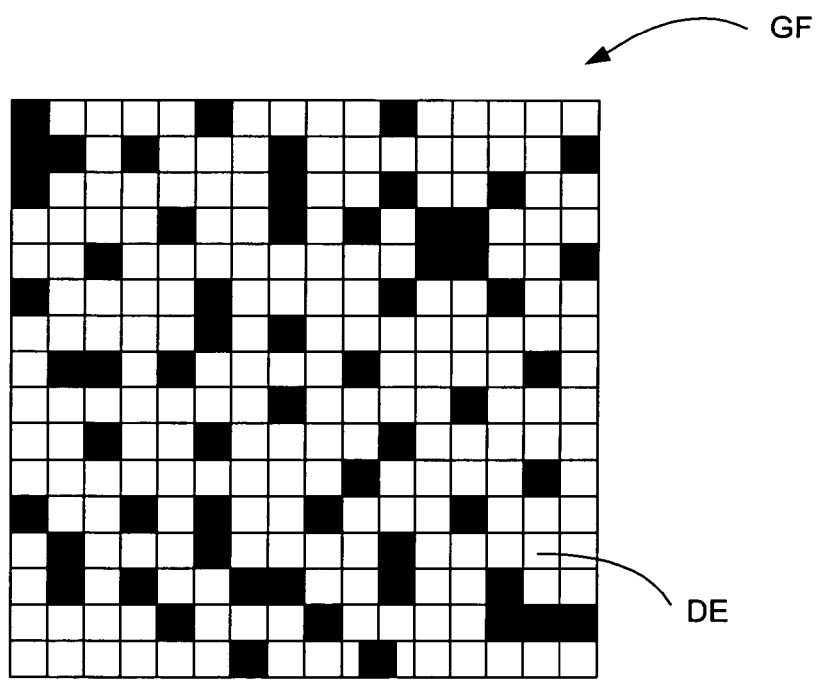
FIG. 7 shows the composition of a gray filter having a plurality of discrete elements.

The gray filtering may also be carried out adaptively. An adaptive gray filter GF is shown in FIG. 7. As can be seen, the gray filter GF is made up of a large number of discrete elements DE which can have their light transmissive and/or reflective characteristics altered. A digital approximation of the analog photon intensity across the beam that is required can be provided by switching the various discrete elements DE appropriately. Thus, the gray filter GF can be illuminated constantly with a beam of constant intensity across its width and it will endow this beam with the correct intensity for cleaning the optical element with a minimum of overexposure. It will be clear that the number of discrete elements DE used determines the resolution of cleaning on the mirror. As an alternative to varying the reflective/transmissive characteristics of each discrete element DE on a sliding scale basis, digital elements can be used which may be set to one of two states—a reflecting state and a non-reflecting state, for example. The time that each discrete element is in the reflecting state then determines the cleaning amount received at a particular position of the optical element surface.

This adaptive solution is particularly useful because the gray filter GF can be incorporated internally in the device and can have its characteristics changed without needing to remove it and replace it. The gray filter GF can thus be changed in situ during cleaning which improves the time taken to perform the cleaning process.

Figure 8:
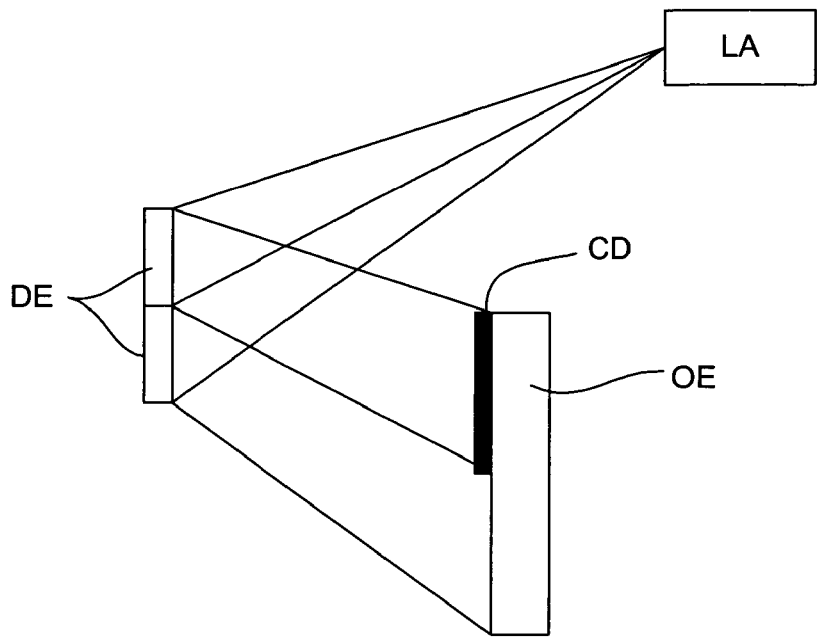
FIGS. 8 and 9 show a pair of discrete elements being illuminated and reflecting light onto the surface of an optical element and demonstrate how the reflective properties of the discrete elements are varied according to an embodiment of the present invention.
Figure 9:
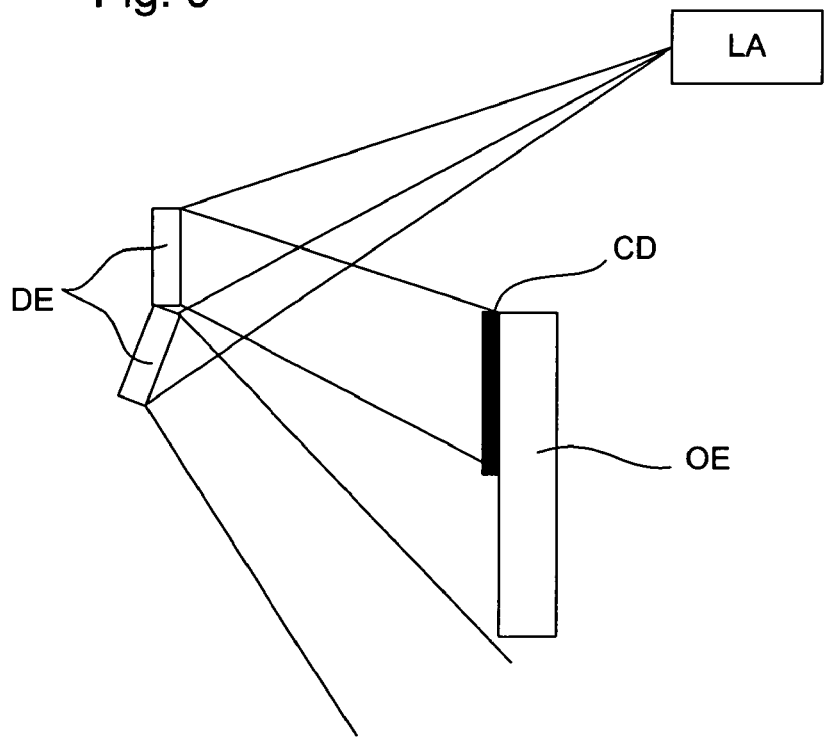

One practical method of creating the filter of discrete elements DE is shown in FIGS. 8 and 9. FIG. 8 shows a pair of discrete elements DE of the filter together with a radiation source LA and an optical element OE to be cleaned. The carbon deposit CD is also shown on the surface of the optical element OE. In FIG. 8, the two discrete elements are shown in the reflecting mode, whereby light from the radiation source LA is reflected across the whole surface of the optical element OE. This will cause overexposure of the bottom part of the optical element OE. FIG. 9 shows the case where the lower discrete element DE is pivoted so as to reflect light away from the surface of the optical element OE. The two discrete elements therefore allow light to be reflected onto those parts of the optical element surface where carbon is deposited but not to be reflected on those parts of the optical element surface where carbon is not deposited.

Variations of this concept may be used so, for example, elements could be used which change the polarization of the received light and a reflective element that is transmissive or reflective depending on the polarization could be used to transmit this light to the optical element OE to be cleaned.

There will be described below, in connection with the fifth aspect of the present invention, the possibility of using an electron beam, rather than a photon beam to clean the mirrors. The electron beam provides the electrons that are required to activate the oxygen which removes the carbon deposits. Since the electron beam can provide a dense intensity of electrons, higher cleaning can be achieved than when a photon beam is used.

Figure 10:
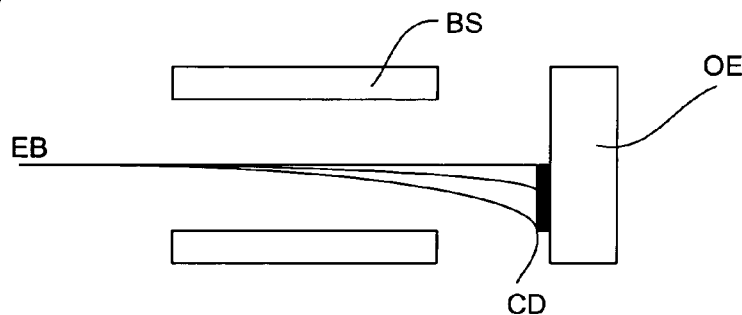
FIG. 10 shows a means of cleaning a surface of an optical element using an electron beam according to an embodiment of the present invention.

An advantage of using an electron beam is that it can be steered using a beam steering unit. Thus, the electron beam can be directed to scan across the surface of the optical element so as to impinge on those areas where carbon deposits are present. Thus, the areas where carbon deposits are not present can be avoided, which will prevent overexposure of some parts of the optical elements. This concept is shown in FIG. 10 where electron beam EB is shown passing through a beam steering unit BS before impinging on the surface of optical element OE. Carbon deposit CD can be seen to span only a portion of the surface of the optical element OE and beam steering unit BS can be calibrated to cause the beam EB to scan only that portion of the surface where carbon deposit CD is present. The three beams shown in FIG. 10 show the electron beam at three different times and it will be appreciated that the electron beam is capable of scanning over all areas of the optical element where carbon is present. The time that the electron beam EB takes to scan the carbon deposit can be adjusted to be in accordance with the thickness of the carbon deposits. Thus, it can be arranged that the electron beam EB scans quite quickly over thinly deposited carbon but more slowly over thickly deposited carbon to ensure total cleaning of the surface of the optical element.

Figure 11:
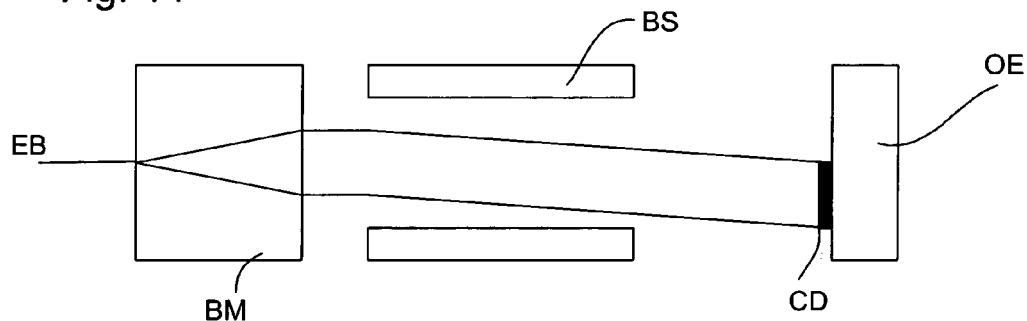
FIG. 11 shows a view similar to that of FIG. 10, but which includes a magnifying device for magnifying the width of the electron beam.

FIG. 11 shows a further development whereby magnifying optics BM are used to expand the width of the electron beam EB prior to steering the electron beam EB with the beam steering unit BS. This allows the electron beam width to be increased so as to reduce the amount of scanning that is required to remove the carbon deposit. In the example of FIG. 11, the beam width is increased to one that matches the width of the carbon deposit CD and the beam steering unit is used to direct the beam toward the carbon deposit.

It will be appreciated that the resolution of local cleaning is only limited by the electron beam diameter and the accuracy of the beam steering unit BS. Since the electron beam provides a faster rate of cleaning, cleaning times can be reduced which translates into greater efficiency of use of the lithographic apparatus.

Third Aspect

This aspect of embodiments of the invention is directed toward obtaining a cleaning process which is faster than the known cleaning process using a photon beam and oxygen. This aspect of embodiments of the invention will be described with reference to FIGS. 12 and 13.

Figure 12:
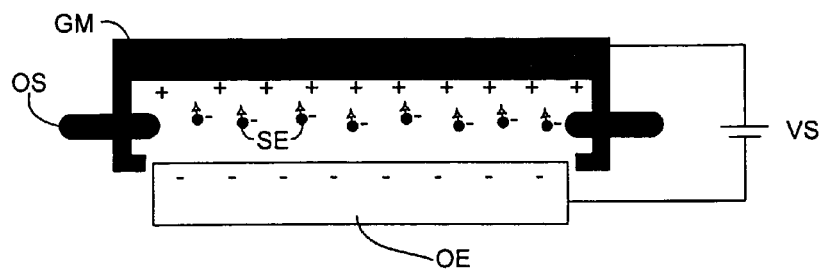
FIG. 12 shows a side view of an optical element and an associated electrical field according to an embodiment of the present invention at a first point in time.
Figure 13:
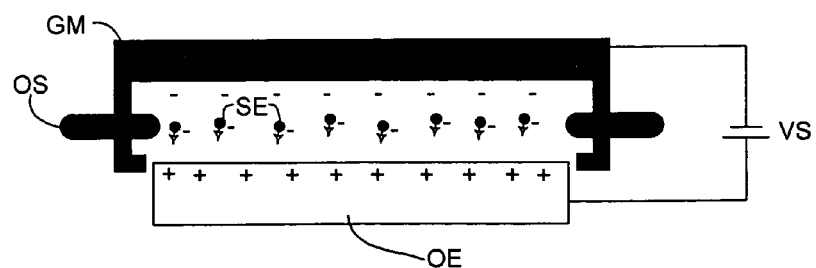
FIG. 13 shows a side view of an optical element and an associated electrical field, similar to that shown in FIG. 12, but at a different point in time.

In FIGS. 12 and 13, the optical element OE is attached to a voltage source VS which applies a potential difference between the optical element and a grid member GM distanced in space from the surface of the optical element to be cleaned. It is understood that the voltage source VS is one example of an electric field generator and embodiments of the invention are not intended to be to limited to the illustrated voltage source VS. In a preferred embodiment, the grid member GM is distanced so that a space of about 1 cm is present between the surface of the optical element and the grid member GM. The voltage VS enables an electrical field to be set up in the space between the surface of the optical element OE and the grid member GM and this is depicted in FIGS. 12 and 13 by the use of "+" and "−" symbols.

In FIG. 12, the electrical field is set up so as to be more positive at points distal from the surface optical element OE so that the secondary electrons SE generated by the interaction of the photons with the surface of the optical element are attracted away from the surface of the optical element and pass through the oxygen in the vicinity of the surface optical element OE. In this movement, some of the secondary electrons SE will activate the oxygen and thereby cause the surface of the optical element to be cleaned. Shortly afterwards, the polarity of the electrical field is reversed by reversing the potential difference supplied by the voltage source VS. This is illustrated in FIG. 13 where it can be seen that the surface of the optical element OE is more positive than the grid member GM. This causes the secondary electrons SE to be attracted toward the surface of the optical element OE so that the secondary electrons make a second pass through the oxygen layer and are thereby available to activate the oxygen to establish the cleaning process. Thus, the reversal of the field causes secondary electrons to pass through the oxygen twice and thus gives a potential increase in the cleaning rate by a factor of 2.

Preferably, the oxygen is supplied by an oxygen supply device OS, or oxygen supply, that is physically attached to the grid member GM and supply oxygen directly into the space between the grid member GM and the surface of the optical element OE.

Fourth Aspect

This aspect of embodiments of the invention is related to the problem that the known cleaning process supplies a cleaning beam of photons and oxygen to every optical element in the apparatus and thus does not take account of the fact that different optical elements require different amounts of cleaning. The first aspect of embodiments of the present invention suggests supplying different amount of photons to each mirror and this aspect of the invention is concerned with supplying different amounts of oxygen to the vicinity of each mirror in order to affect a different cleaning rate for different mirrors. This can be achieved using means that are similar to those that are used to carry out the third aspect of the invention, namely, the grid member GM and associated voltage source VS. It will be explained with reference to FIGS. 14, 15 and 16.

As in the third aspect of embodiments of the invention, the voltage source VS is used to establish an electrical field that spans the gap between the surface of the optical element OE and the grid member GM. The voltage source VS applies a potential difference across the gap such that the surface of the optical element OE is more positively charged than the grid member GM. At the same time, the oxygen supply device OS supplies oxygen that has been charged by a charging device CD to have a negative charge. This means that charged oxygen molecules which are supplied by the oxygen supply device are attracted towards the surface of the optical element OE. This serves to set up a concentration gradient of oxygen so that the partial pressure of oxygen in the system will be greater nearer the surface of the optical element OE than it is at points distal from the surface of the optical element OE. This means that the cleaning beam of radiation will have a greater effect in cleaning the surface of the optical element OE because there will be a greater local concentration of oxygen. It can therefore be seen that applying the electrical field with the voltage source VS causes a greater cleaning effect to be carried out than when the electrical field is not applied. Therefore, control of the cleaning rate at individual mirrors can be carried out simply by controlling the electrical field adjacent to each mirror and supplying charged oxygen to the whole of the system.

This solution has been found to be useful because it is difficult to change the local concentration of oxygen using, for example, an oxygen pressurization device, or oxygen pressurizer, that is local to each mirror. It is much more cost effective to simply supply the whole system with oxygen and use the electrical field to increase the local concentration rather than attempt to have local oxygen reservoirs, the pressure of which can be individually changed for a specific optical element OE.

Figure 16:
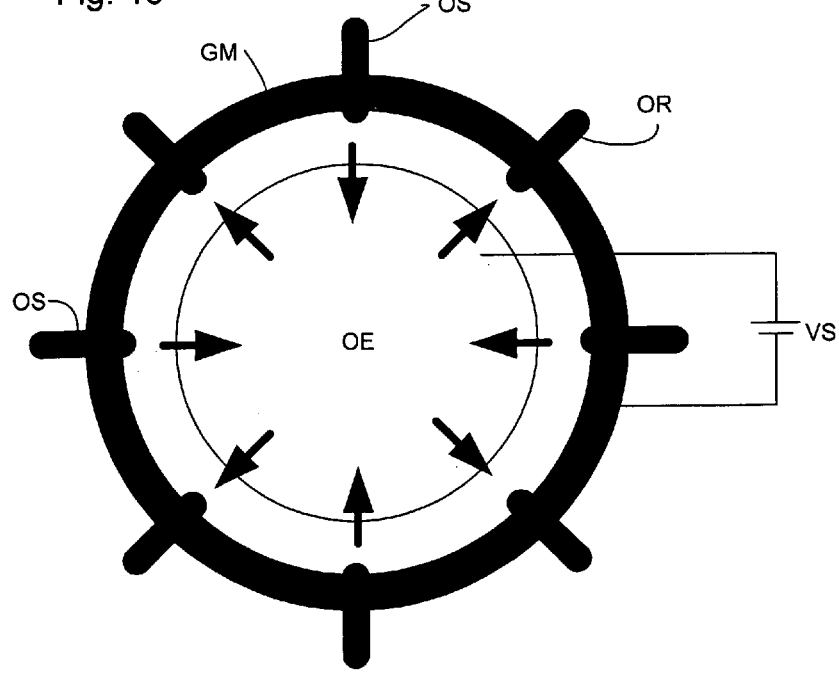
FIG. 16 shows a plan view of the configuration of FIGS. 12 to 15.

FIG. 16 shows a plan view of the optical element OE and grid member GM. The arrows show the charged oxygen molecules entering through the oxygen supply device OS into the space adjacent to the optical element surface. The electrical field tends to hold the charged oxygen molecules adjacent to the surface. There may also be supplied means for venting the oxygen and these are shown in FIG. 16 as oxygen removal means OR. Thus, a constant flow of oxygen can be maintained such that the charged oxygen particles can be replenished.

It is preferable to negatively charge the oxygen particles so that the charge is not lost when the oxygen particles come into contact with the secondary electrons. This fact means that it is preferable to make the electrical field more positive at the optical element's surface than at the distal points of the grid member GM.

Figure 14:
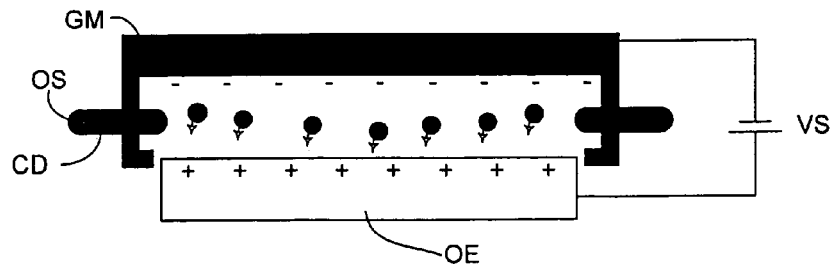
FIG. 14 shows a side view of an optical element and an associated electric field according to an embodiment of the present invention.
Figure 15:
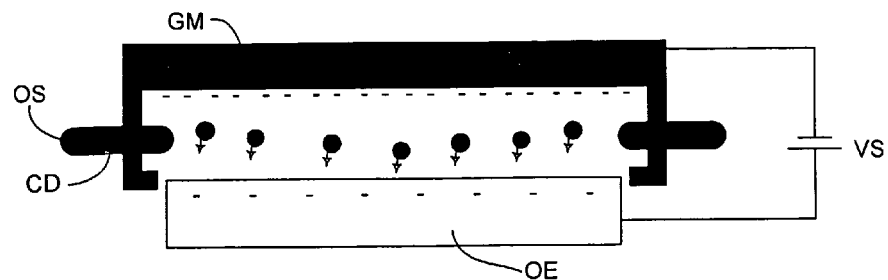
FIG. 15 shows a side view of an optical element and an associated electrical field, similar to that shown in FIG. 14, but with a different electrical field.

FIG. 14 shows a configuration whereby the surface of the optical element OE has a positive charge and the grid member GM is given a negative charge. While this will work to keep the negatively charged oxygen particles within the vicinity of the surface of the optical element, there is a chance that when the negatively charged oxygen particles reach the surface, they will be de-charged due to the positive charge found at the surface. To overcome this, the configuration shown in FIG. 15 is used whereby the surface of the optical element OE is negatively charged but the grid member is more negatively charged. Thus, the surface of the optical element OE will be positively charged with respect to the grid member but negatively or neutrally charged with respect to the oxygen particles. This will ensure that the particles are not de-charged but at the same time maintains the effect of keeping the oxygen molecules near to the surface of the optical element.

Fifth Aspect

It has already been mentioned in connection with the second aspect of the invention that a cleaning beam of electrons may be used instead of a cleaning beam of photons. It has been found that a cleaning beam of photons requires an interaction with the surface of the optical element in order to liberate secondary electrons, which then activate the oxygen and cause the cleaning process to occur. The advantage of using a cleaning beam of electrons is that a greater density of electrons can be provided and the overall cleaning rate can be increased such that cleaning times are decreased.

Figure 17:
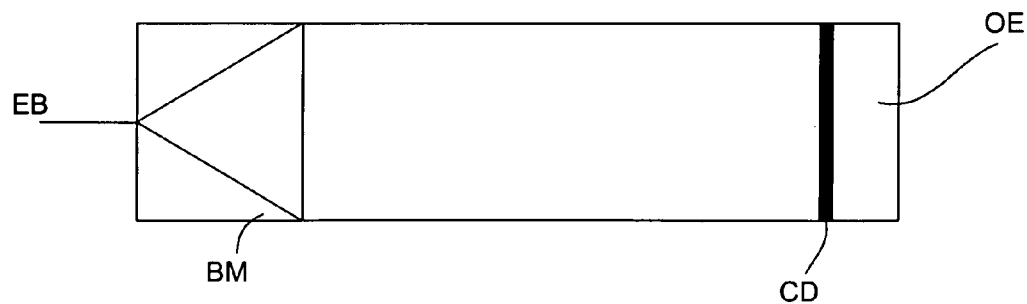
FIG. 17 shows a view similar to that of FIG. 11 except that the beam magnifier causes a greater magnification of the electron beam and there are no beam steering device.

The apparatus shown in FIGS. 10 and 11 can be used to implement the fifth aspect of embodiments of the invention and it should be mentioned that it is not essential in this aspect of the invention for any spatial variation to occur across the surface of the optical element to be cleaned. If the optical element has a uniform distribution of carbon deposits, as shown in FIG. 17, then a beam magnifier BM may be used to bathe the surface of the optical element OE in a uniform beam of electrons. This is useful for the first mirrors of the illumination system which generally, in use, receive a uniform radiation intensity and thus generally have a uniform build-up of carbon deposits. It will be appreciated, that in this instance, a beam steering unit BS is not required.

Sixth Aspect

This aspect of embodiments of the invention is concerned with the problem that water vapor or hydrocarbon gases can infiltrate into or are present after start-up of the vacuum system of the lithographic apparatus and stick to the surfaces of optical elements OE. If the water molecules are exposed to high energy photons in an exposing step, oxidation of the surface will occur, which leads to irreversible reflection loss. If hydrocarbons are exposed to high energy photons in an exposing step, this leads to contamination of the optical element.

The sixth aspect of embodiments of the invention proposes the solution of breaking the bonds of water molecules or hydrocarbon gas molecules that are stuck to the optical elements using low energy photons, preferably in the infrared region. This reduces the number of molecules attached to the optical element. The energy of the photons is chosen so that the optical element does not absorb the energy and keeps its reflective properties and also ensures that the photons do not crack the molecules. This provides the advantage that less contamination is created on the optical elements.

As an alternative to an infra-red beam, microwaves may be used to excite the water molecules to a higher energy stage (e.g. heating) and thereby reduce the time that the molecules adhere to the optical elements. A microwave generator may be used to generate the microwaves. The use of microwaves means that the optical element itself will not be heated to any appreciable extent and will be substantially unaffected in terms of its properties.

This method may be generally applied to the whole vacuum system which can be bathed in infra-red radiation so as to reduce the number of molecules attached to the inner surfaces of the vacuum system. These molecules can then be pumped away. As is the case in the examples above, the energy of the photons is chosen so that the optical elements in the vacuum system do not appreciably absorb the photons so that they keep their reflective qualities. Also, the energy is chosen so that the photons do not crack the molecules. Once the bonds of the water molecules or hydrocarbon gas molecules are broken, they are pumped away. The system can be provided to perform cleaning in real time so as to ensure continual cleaning of the inner surfaces of the vacuum system with continuous pumping away of the contaminant molecules. Since contamination is not allowed to build up to any appreciable extent, the pump downtime of the vacuum system is shortened.

The low energy photons and the microwaves are effective in reducing contamination, but at the same time do not serve to damage or contaminate the surfaces of the various optical elements in the system. In particular, it has been found that high energy photons can cause silicon oxide contamination on the optical elements. This is caused when the vacuum inside the system is not perfect, and water vapor or other contaminants are present. The methods of the sixth aspect of embodiments of the invention excite the contaminating molecules and allow them to be pumped out of the apparatus by the standard vacuum pump in the initial pumpdown of the apparatus. In connection with this, the low energy photons or microwaves can be applied generally into the cavities of the system and do not have to be focused or directed towards any one optical element. The fact that the low energy photons and microwaves will interact with any contaminants situated anywhere in the system will cause a reduction in contamination of the optical elements because the low energy photons or microwaves excite the contaminants so that they may be pumped out of the system. While water vapor is a particular problem, the method is effective to reduce other types of contamination, especially dipole molecules. The invention has the advantage that the pumpdown time can be decreased because it will be easier to pump out the contaminants when they are in the excited (heated up) state.

While specific embodiments of the invention have been described above, it will be appreciated that the invention may be practiced otherwise than as described. The description is not intended to limit the invention.

What is claimed is:

1. A lithographic projection apparatus comprising:
a radiation system that provides a beam of radiation;

a support structure that supports a patterning structure, the patterning structure configured to pattern the beam of radiation according to a desired pattern;

a substrate support that supports a substrate;

a projection system that projects the patterned beam onto a target portion of the substrate;

an optical element that forms part of said radiation system, said patterning structure, or said projection system; and a cleaning device that supplies a cleaning beam of radiation to the surface of said optical element, said cleaning device comprising an electric field generator that establishes an electrical field near the surface of said optical element;

a gas supply that supplies a reactive gas to the vicinity of said optical element to be cleaned; and a charging device that charges molecules of the reactive gas.

2. The apparatus according to claim 1, wherein said electric field generator is configured to establish a field that tends to attract said charged gas molecules towards the surface of the optical element so as to create a higher concentration of gas near the surface of said optical element.

3. The apparatus according to claim 1, wherein said charging device is configured to endow said gas molecules with a negative charge and said electric field generator is arranged to establish an electrical field that is more positive near to the surface of the optical element than points further away from the surface.

4. The apparatus according to claim 3, wherein the surface of said optical element is itself negatively charged and distal points in space away from the surface of said optical element are more negatively charged than the surface such that the surface is positively charged relative to the distal points, but negatively or neutrally charged relative to the charged reactive gas molecules.

5. The apparatus according to claim 1, wherein said electric field generator is arranged to establish an electrical field that varies over a space of about 1 cm from the surface of the optical element.

6. The apparatus according to claim 1, wherein said electric field generator is physically attached to said gas supply such that the gas is supplied directly into the region over which the electrical field extends.

7. The apparatus according to claim 1, wherein said reactive gas comprises oxygen.

8. The apparatus according to claim 1, wherein said cleaning beam of radiation is a photon beam.

9. The apparatus according to claim 8, wherein said cleaning beam of radiation is non-EUV radiation.

10. The apparatus according to any one of claim 1, wherein said cleaning beam of radiation is an electron beam.

11. A lithographic projection apparatus cleaning method comprising:

establishing an electrical field near a surface of an optical element that forms part of a radiation system, a patterning structure, or a projection system of a lithographic projection apparatus;

charging reactive gas molecules; and supplying said charged reactive gas molecules to the vicinity of said optical element.

12. A device manufacturing method comprising:

providing a beam of radiation using a radiation system;

patterning the beam of radiation with a patterning structure;

projecting the patterned beam of radiation onto a target portion of a substrate using a projection system; and cleaning an individual optical element or a subset of optical elements that form part of the radiation system, the patterning structure, or the projection system, wherein said cleaning said optical element comprises establishing an electrical field near a surface of said optical element;

charging reactive gas molecules; and supplying said charged reactive gas molecules to the vicinity of said optical element.

* * * * *